(12) United States Patent
Taran

(10) Patent No.: US 7,371,973 B1
(45) Date of Patent: May 13, 2008

(54) CONTACT NODE

(76) Inventor: Alexandr Ivanovich Taran, 103575, Zelenoorad, koro, 1001, kv8, Moscow (RU)

( * ) Notice: Subject to any disclaimer, the term of this patent is extended or adjusted under 35 U.S.C. 154(b) by 0 days.

(21) Appl. No.: 09/830,635

(22) PCT Filed: Mar. 4, 1999

(86) PCT No.: PCT/RU99/00062

§ 371 (c)(1),
(2), (4) Date: Aug. 2, 2001

(87) PCT Pub. No.: WO00/35257

PCT Pub. Date: Jun. 15, 2000

(30) Foreign Application Priority Data

Dec. 8, 1998 (RU) .............................. 98121773/09

(51) Int. Cl.
*H01R 12/04* (2006.01)
*H05K 1/11* (2006.01)
(52) U.S. Cl. ..................................... 174/262; 361/792
(58) Field of Classification Search ........ 174/262–266; 361/792–795
See application file for complete search history.

(56) References Cited

U.S. PATENT DOCUMENTS

| 5,406,459 | A | * | 4/1995 | Tsukamoto et al. ......... 361/768 |
| 5,729,440 | A | * | 3/1998 | Jimarez et al. ............. 361/779 |
| 5,920,123 | A | * | 7/1999 | Moden ....................... 257/774 |
| 6,010,769 | A | * | 1/2000 | Sasaoka et al. ............. 428/209 |
| 6,013,877 | A | * | 1/2000 | Degani et al. .............. 174/264 |
| 6,054,761 | A | * | 4/2000 | McCormack et al. ....... 257/698 |
| 6,100,475 | A | * | 8/2000 | Degani et al. .............. 174/264 |

* cited by examiner

Primary Examiner—Jeremy C Norris
(74) Attorney, Agent, or Firm—Knobbe Martens Olson & Bear LLP

(57) ABSTRACT

The contact node comprises at least two metallized contacts coupled with conductive paths arranged on surfaces of connection layers made on the base of a dielectric material and mutually aligned and interconnected electrically and mechanically by conductive binding material. The contact node is a joint between a contact made in the form of a metallized pad coupled with a conductive path on the surface of the underlying connection layer and a respective contact made in the form of a metallized hole in a dielectric material layer.

9 Claims, 4 Drawing Sheets

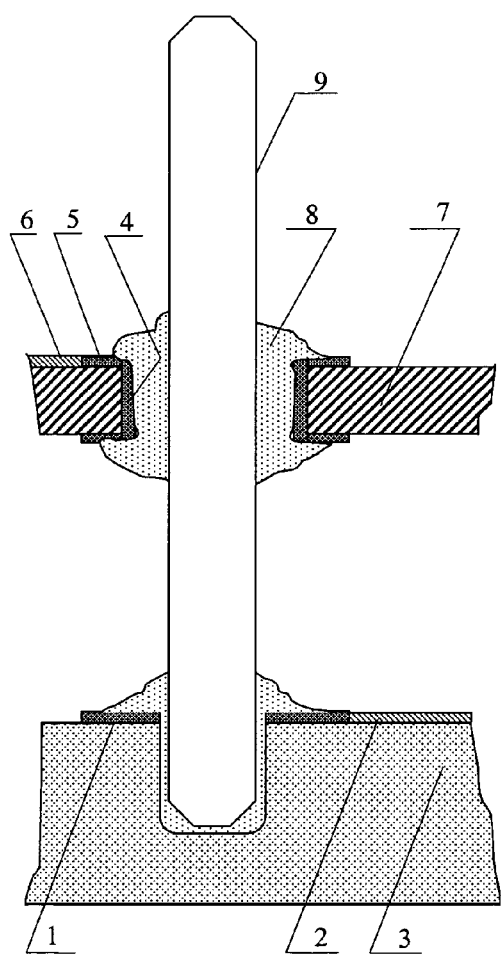 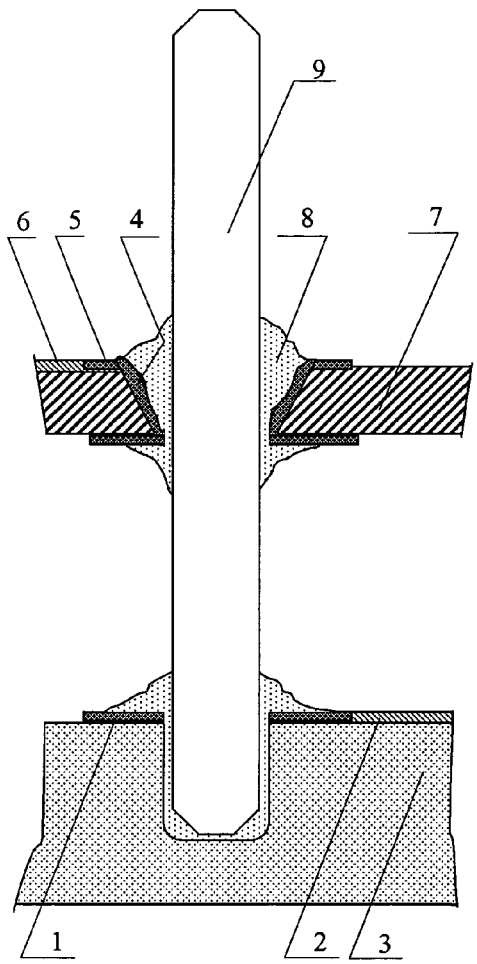
FIG. 6a  FIG. 6b

CONTACT NODE

FIELD OF THE INVENTION

The invention relates to the manufacturing of permanent connections in producing the equipment based on microelectronics components and semiconductor devices, and particularly to contact nodes by which the assembling, including the assembling of multilayered connection plates for the multichip modules (MCM) as well as the mounting of LSIC chips in manufacturing the MCM are performed.

BACKGROUND OF THE INVENTION

It is known that permanent connections provide a high reproducibility, quality and reliability of an electronic equipment. In the microelectronics equipment designs, most of permanent connections are formed by joining pairs of contact into contact nodes during producing operations (soldering, welding, spraying, galvanic build-up etc.)

At the moment the requirements to provide a speed performance and miniaturization become increasingly crucial in creating and manufacturing the modern electronic equipment.

The promising direction of development is to create the equipment on the base of housing-less components, including LSIC, in the form of multichip modules which are characterized by a high component mounting density, interconnection topology optimization and increase of the speed performance of the MCM equipment.

In that connection, efforts of many microelectronics equipment designers' are directed to develop multilayered connection structures with high interconnection density with a reliable contacting of conductors being in adjacent connection layers as well as methods for joining housing-less components, and first of all, multi-lead LSIC chips to mounting contacts of multilayered connection structure as a part of the MCM.

One of the almost insurmountable obstacle for obtaining the high interconnection density in the MCM multilayered substrates is in the forming of a great number (several thousands) of reliable contact nodes having identical features and connecting the conductors from different connection layers into single topology of the multilayered structure.

Other, no less hard problem is to joining reliably and reproducibly the contact pads of LSIC chips to respective contact pads of the multilayered MCM structure.

The chips of modern LSICs (for example, Pentium chips) have dimensions exceeding 1 sq. cm, more than 400 contact pads and clock operating frequencies greater than 400 MHz. An assembling of such chips into a single MCM node with chips of Cash memory is a very actual problem. Actuality of this problem would only increase with developing the microelectronics equipment manufacture and LSIC element base.

The contact node as a component of the MCM multilayered connection structure could be a combination of at least two metallized contacts, for example, in the form of coaxially jointed metallized holes made in two adjacent connection layers interconnected electrically and mechanically.

The contact node for mounting a LSIC chip as a component of the MCM also could be represented by a combination of two aligned contacts one of which being on a chip surface and a respective contact being on the MCM mounting layer. The contacts are interconnected by a conductive structure, which could be, depending on forming method, as follows:

- a wire welded to the contacts;
- a jumper formed on the dielectric material film and welded to the contacts;
- a tinned protrusion previously formed on one contact and soldered to another one.

Variety contact node designs for mounting the chips could be divided into following types (Мазур А. и др. процесс ысварки и пайки в производстве полупроводников ых приборов. М.: "Радио и связь", 1991. С. 38-39— Mazur A. et al. Welding and soldering processes in manufacturing the semiconductor devices. Moscow: "Radio and Sviaz", 1991. Pp. 38-39).

Type 1 is characterized by an arrangement of contacts being connected (one contact on the chip surface, other one on the mounting surface) in different parallel planes. In so doing, the contacts are faced by working surfaces to one side and connected by extended intermediate elements, for example, by wire welded to the contacts.

Type 2 is characterized by an arrangement of contacts in one plane. The contacts are also connected by extended intermediate elements which are beam connectors.

Type 3 is similar to Type 1, the contact pads are also arranged in the parallel planes, but faced to each other with their working surfaces. The intermediate element of extended type is a beam on the polyimide film.

It is necessary to note two main disadvantages of above mentioned types of the contact nodes:

- a utilization of defect-forming producing operations (welding);
- a non-group character of main assembling operations (forming every contact node individually and sequentially, with two weldings for every contact node).

Type 4 is similar to Type 3, but the contacts are mutually aligned, whereby the intermediate element has a minimal extension and is made in the form of protrusion having the bump or ball form previously formed on the chip contact. A connection of the contacts is performed by soldering.

An advantage of the Type 4 contact node is a group character of preliminary and assembling operations (assembling all contact nodes simultaneously).

Main disadvantages are as follows:
- the impossibility to perform direct visual and electrical control of process and results of the contact node assembling due to the fact that the chip turned by its "face" (and all contact pads) to the substrate covers all aligned respective contact pads on the substrate;
- the lack of natural exit for working waste of assembling (for example, the flux) from a very narrow gap between the substrate and chip due to substantial capillary forces in this gap;
- the lack of effective methods for withdrawing the working waste of assembling from the gap between the substrate and chip, which leads to degradation phenomena in the chip during its exploitation and to decreasing in a reliability of the chip operation.

The contact node used in assembling the polyimide connection layers into multilayered operation plate is known, consisting of two contacts in adjacent layers which contacts are made in the form of metallized holes which with form, together with metallized holes of other layers, the matrix of through channels piercing all plate layers throughout. After coaxial alignment and jointing, all pairs of contact through holes are interconnected by the method of vacuum soldering (панов Е.Н. Особенности сборки специализированн ых БИС на базовых матричных кристаллах. М.:

"Высшая школа", 1990. C. 33-34. Panov E. N. The peculiarities of assembling the specialized LSIC on basic matrix chips. Moscow: "Vysshaya Shkola", 1990. Pp. 33-34).

However, such construction of the contact node leads to greater expenditure of usable plate area for through channel matrix, which decrease sufficiently the interconnection spreading density, lead to increase number of plate layers and number of soldered joints, i.e. decrease the manufacture adaptability of the plate and increase its cost while degrading reliability characteristics.

The closest to the present invention by the technical essence and achieved result during its utilization is the contact node including two contacts, one of which contacts is made in the form of metallized tinned protrusion having a bump or ball form on a contact pad of LSIC chip, and the second contact is in the form of metallized contact pad coupled with conductors on a mounting surface of a connection structure. After their aligning, the contacts are interconnected electrically and mechanically by means of a conductive binding structure (Моряков О.С. Технология полупроводниковых приборов и изделий микроэлектроники. М.: "Высшая Школа", 1990. C. 38-40—Moryakov O. S. Technology of semiconductor devices and microelectronics items. Moscow: "Vysshaya Shkola", 1990. Pp. 38-40).

Such contact node design is characterized by:
  great technological difficulties in forming protrusions of complex form and structure and uniform by height on the contact pads of the LSIC chips having a multiplicity of leads (500 contacts and over);
  utilizing the defect-forming producing operations and processes in forming 3D protrusions on the LSIC contact pads;
  the impossibility to perform direct visual and electrical inspection of the process and results in assembling a great number of contact nodes placed in a very narrow gap between the substrate and the chip;
  great difficulties in withdrawing the working waste, being formed during the process of soldering the contact nodes, from the gap between the chip and substrate, which effects negatively on the reliability of connections.

SUMMARY OF THE INVENTION

The problem to be solved by the present invention consists in creating such universal contact node which utilizing in microelectronics equipment would allow to eliminate the above mentioned disadvantages of contact nodes being existed and utilized in both assembling the multilayered connection structures (MCS) and mounting the chips onto the MCS.

The technical result caused by utilizing the universal contact node of the proposed design in the MCM mass production would allow to provide:
  a high contact spreading density in multilayered structures for the MCM as well as a high density of mounting LSIC chips in the MCM;
  a minimization of parasite impedances in the MCM, improvement of the "signal-noise" ratio in MCM interconnections and substantial increase of operation clock frequencies and speed performance of the MCM equipment;
  a possibility for group manufacturing and preparing the components of the contact nodes for assembling the multilayered connection structures in a single producing cycle;
  a possibility for group assembling all contact nodes in a single operation cycle both in the multilayered connection structures and during the process of mounting chips in MCM devices;
  an exclusion of the defect-forming operations (like welding) during the process of mounting chips in MCM device;
  a separate implementing of the processes of element forming and contact nodes assembling proper, which is particularly important to maintain the reliability resource of LSIC chips sensitive to technological effects;
  an exclusion of the usage of expensive multi-lead housings for LSIC chips in the microelectronics equipment;
  an exclusion of the usage of precious metals and deficit materials;
  a decrease of the cost in producing the microelectronics equipment on a housing-less element base (MCM equipment) to commercially acceptable levels.

The aforementioned technical result is achieved at the cost of fact that the contact node comprising at least two metallized contacts coupled with conductive paths arranged on surfaces of connection layers made on the base of a dielectric material and mutually aligned and interconnected electrically and mechanically by conductive binding material, is a joint between a contact made in the form of metallized contact pad coupled with the conductive paths on the surface of the connection layer, and a respective contact jointed with said pad and made in the form of metallized hole in an upper-lying connection layer, the lower edge of the metallized hole being faced to the metallized contact pad on the surface of the underlying connection layer, and the upper edge of said hole being coupled with the conductive paths on the upper surface of the upper-lying connection layer;
  and also by that the metallized hole is made in the form of cylinder;
  and also by that the metallized hole is made in the form of truncated cone, the lesser base of the truncated cones being faced to the contact pad on the surface of the underlying connection layer, and the greater base of the truncated cones being coupled with the conductive paths on the upper surface of the upper-lying connection layer;
  and also by that an integrated circuit chip oriented by its metallized contact pads to corresponding metallized holes in the upper-lying connection layer is used as a connection layer with metallized contact pads respective to the metallized holes in the upper-lying connection layer;
  and also by that the metallized contact pad is made flat;
  and also by that a protrusion interacting with the respective metallized hole is formed in the center of the metallized contact pad respective to the metallized hole;
  and also by that the protrusion is made from a conductive material in the form of cylinder, cone or sphere;
  and also by that the protrusion is made of solder;
  and also by that a contact respective to the metallized hole is made in the form of a rod fixed in the underlying connection layer orthogonally to its surface and inserted into the metallized hole;

and also by that the rod is made from a conductive material in the form of cylinder or polygon, and grooves are made along the generatrix of the rod, which grooves could be interrupted;

and also by that the rod is made from an electrical insulating material with a conductive coating;

and also by that the upper edge of the metallized hole coupled with the conductive paths and the lower edge of the metallized hole are made with a metallized rim along the periphery of the edge;

and also by that the upper edge of the metallized hole coupled with the conductive paths on the surface of the connection layer is made with a metallized rim along the periphery of the edge;

and also by that the diameter D of the greater base of the truncated cone, the width h of the metallized rim, the diameter d of the lesser base of the truncated cone, the thickness t of the dielectric material of the connection layer and the minimal width L of the respective metallized contact pad on the underlying connection layer are coupled with the following relationship:

$$L \geq D+2h=d+2t+2h;$$

and also by that the upper and lower edges of the metallized hole in the form of cylinder have a facet.

BRIEF DESCRIPTION OF THE DRAWINGS

The invention is illustrated with graphic materials, where FIG. 1, FIG. 2a, b, FIG. 3a, b, FIG. 4a, b, FIG. 5a, b, FIG. 6a, b depict schematically the fragments of proposed contact node.

FIG. 6a depicts the contact node with the metallized hole in the form of cylinder and a respective contact in the form of rod.

FIG. 6b depicts the contact node with the metallized hole in the form of truncated cone and the contact in the form of rod.

THE PREFERRED EMBODIMENT OF THE INVENTION

Figure 1:
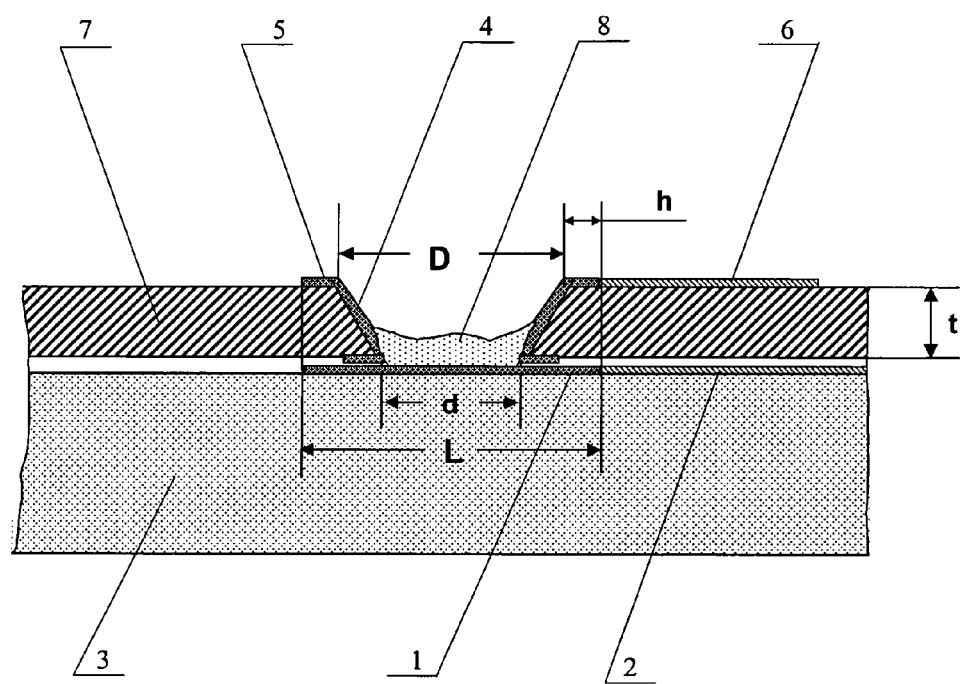
FIG. 1 schematically depicts the principal view of the contact node.

Referring now to FIG. 1, a contact node comprises a metallized contact pad 1 electrically coupled with conductive path 2 on the surface of an underlying connection layer 3. A respective contact in the form of a metallized hole 4 is made in the upper-lying connection layer 7. The lower edge of metallized hole 4 is jointed with the metallized contact pad 1, and its upper edge is connected via a metallized rim 5 with conductive path 6 on the surface of the upper-lying connection layer 7. A conductive binding material 8 joins electrically and mechanically both contact into a single contact node.

In the case of assembling the contact node by spraying the binding material 8, the metallized hole 4 is aligned with the respective metallized contact pad 1, a protective mask (not shown in FIG. 1) is superimposed, aligned and fixed, after which the assembled technological stack is placed into the spraying plant, where a successive layer-by-layer spraying of the conductive materials forming a conductive binding structure with necessary features is performed.

In that a way is performed a group assembling of the great number of the contact nodes coupling the conductors in adjacent connection layers of the multilayered connection structure or the contact pads of the chips with respective contacts of the mounting layer of the multilayered connection structure in the MCM.

After connecting the layers in the spraying plant, if necessary, a step of visual and electrical inspecting of the formed contact node quality is performed.

When assembling the contact nodes by soldering, all metallized contact pads previously tinned are aligned with the respective metallized holes being also tinned, the surfaces with the contacts are fixed relatively to each other, for example, by glue composition, after which the stack is placed into the vacuum soldering plant. In conditions of partial vacuum and common heating up to the temperature of solder melting, a joint soldering in every contact node is occurred simultaneously under effect of capillary forces.

Figure 2A:
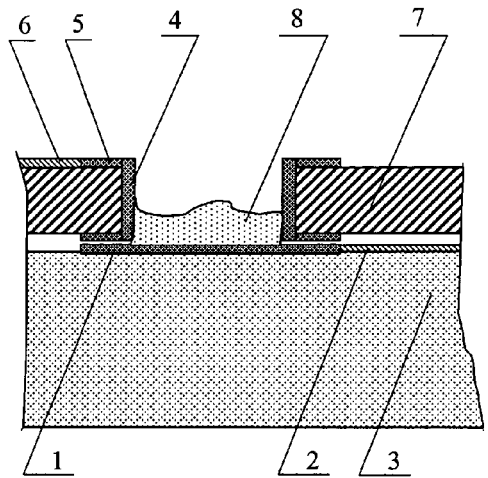
FIG. 2a depicts the contact node with the metallized hole in the form of cylinder.
Figure 2B:
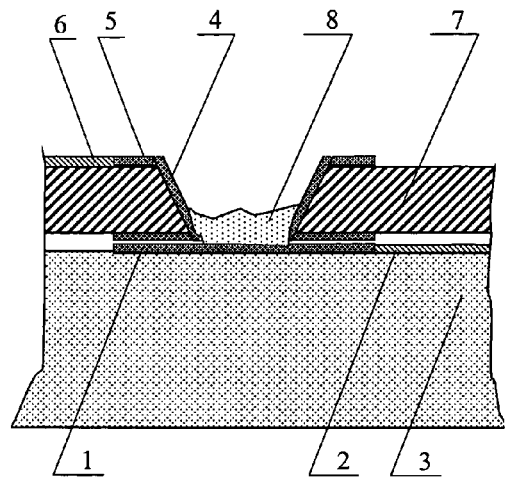
FIG. 2b depicts the contact node with the metallized hole in the form of truncated cone.

FIG. 2a, FIG. 2b depicts the contact nodes with the flat metallized contact pad 1, in one case the respective metallized hole being made in the form of cylinder 4, and in other in the form of the truncated cone 4.

Figure 3A:
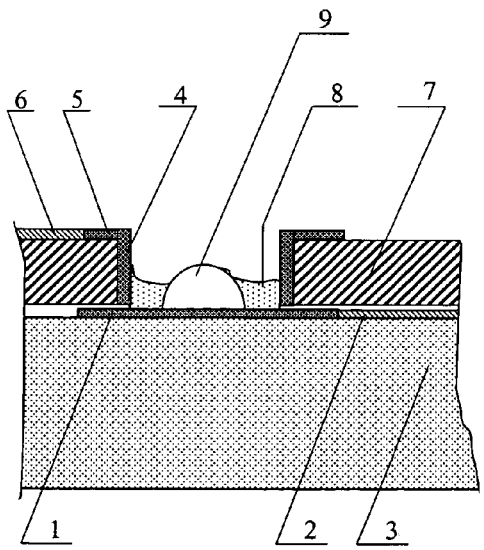
FIG. 3a depicts the contact node with the metallized hole in the form of cylinder and a protrusion in the form of sphere.
Figure 3B:
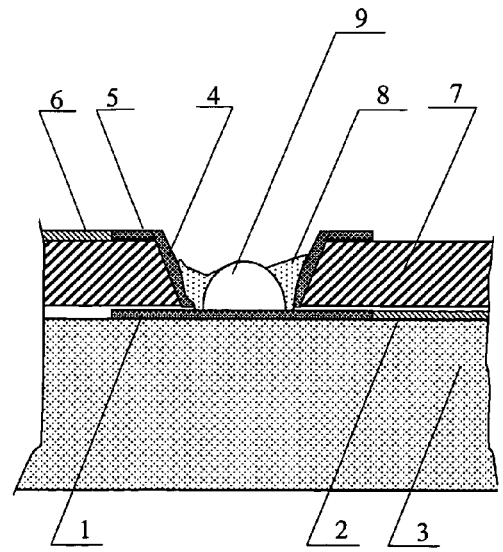
FIG. 3b depicts the contact node with the metallized hole in the form of truncated cone and the protrusion in the form of sphere.

FIG. 3a, FIG. 3b depicts the contact nodes with the metallized holes in the form of cylinder 4 and truncated cone 4 accordingly, and the respective metallized contact pads 1 have the metallized protrusion in the form of a sphere 9 in the central part.

Figure 4A:
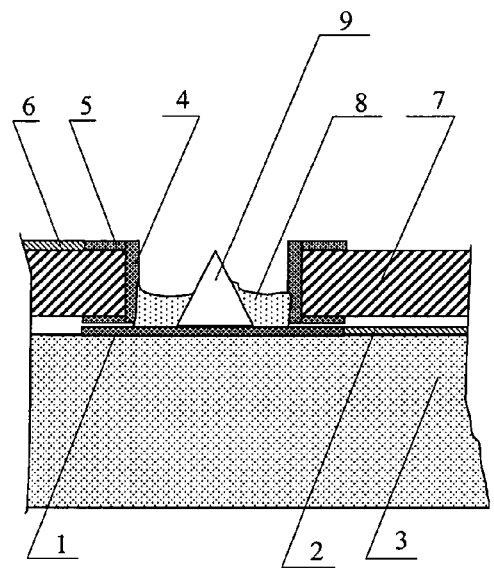
FIG. 4a depicts the contact node with the metallized hole in the form of cylinder and the protrusion in the form of cone.
Figure 4B:
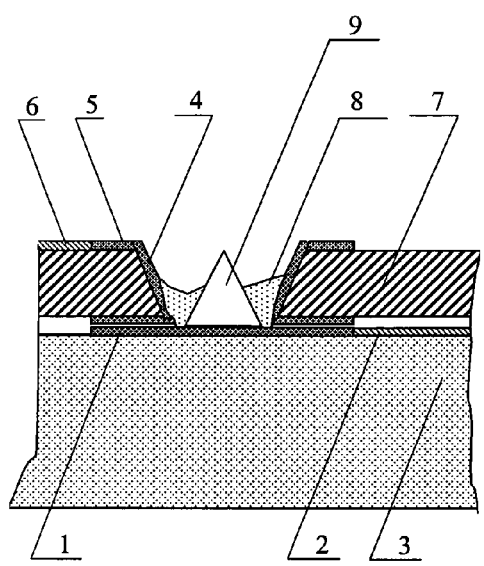
FIG. 4b depicts the contact node with the metallized hole in the form of truncated cone and the protrusion in the form of cone.

FIG. 4a, FIG. 4b depicts the contact nodes with the metallized holes in the form of cylinder 4 and truncated cone 4 accordingly, and the respective metallized contact pads 1 have the metallized protrusion in the form of a cone 9 in the central part.

Figure 5A:
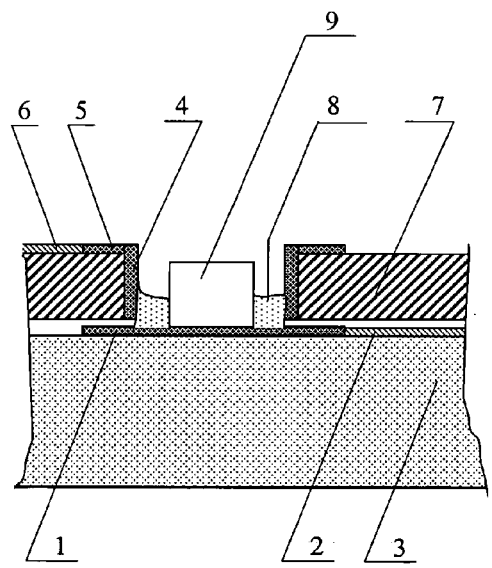
FIG. 5a depicts the contact node with the metallized hole in the form of cylinder and the cylinder protrusion.
Figure 5B:
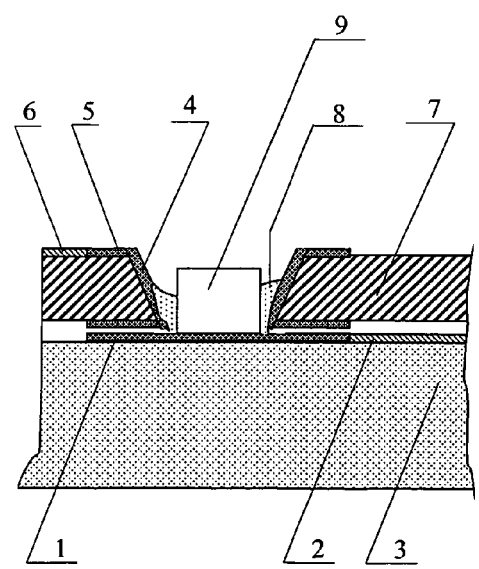
FIG. 5b depicts the contact node with the metalized hole in the form of truncated cone and the protrusion in the form of cone.

FIG. 5a, FIG. 5b depicts the contact nodes with the metallized holes in the form of cylinder 4 and truncated cone 4 accordingly, and the respective metallized contact pads 1 have the metallized protrusion in the form of a cylinder 9 in the central part.

Such contact nodes are suitable both for assembling by spraying and for assembling by soldering.

The presence of the protrusion in the central part of the metallized contact pad inserted into the metallized hole allows to ensure the reliable alignment of the elements simultaneously for a great number of the contact nodes without utilizing the precision systems of aligning, thereby substantially reducing the labor input and duration of the operations of aligning and mutual positioning the connection layers, and also of operations of oriented placing the multi-lead LSIC chips on the mounting connection structure when forming the corresponding protrusions on the metallized contact pads of LSICs.

Moreover, the metallized protrusion increases the overall area of electrical contacting of the elements of the contact node and also its mechanical strength.

FIG. 6a, FIG. 6b depicts the contact nodes with the metallized holes in the form of cylinder 4 and truncated cone 4 accordingly, and the respective metallized contacts are made in the form of rods 9 inserted into the metallized holes 4.

Such design of the contact node allows a simple and reliable joining of several connection layers with the chips mounted on them into a single multichip module of a high degree of integration, and also to provide the forming of joint connectors with pin contacts as a part of the multilayered connection structures.

An interaction of the contact node elements during their functioning occurs as follows (by the example of FIG. 1 fragment).

A signal from the conductive path 6 of the connection layer 7 passes through the metallized hole 4 in the connection layer 7, the conductive binding material 8 and the metallized contact pad 1 on the surface of the connection layer 3 to the conductive path 2. Thereby the electrical connection of the conductive path 6 on the upper-lying connection layer 7 with the conductive path 2 in the under-lying connection layer 3 takes place.

INDUSTRIAL APPLICABILITY

An implementation of the contact node in accordance with the present invention allows to provide:
- a group character of the process for forming the contact nodes both in assembling the multilayered connection plates and structures and in mounting the housing-less LSIC chips in one-chip and multichip modules, thereby providing a high productivity of electronic equipment assembling;
- an exclusion from the route of assembling the defect-forming welding processes, thereby providing a high percentage of valid item production in their manufacturing and a high reliability of the equipment in the exploitation;
- a high specific density of the connection elements of multilayered connection plates and structures while minimizing the number of connection layers;
- a high density of mounting of the housing-less LSIC chips and other components with planar arrangement of the metallized contact pads consisting in the multichip modules, thereby substantially increasing the specific functional characteristics of such electronic equipment;
- a utilization of LSIC chips with matrix arrangement of the metallized contact pads on the surface of the chips in the coordinate grid having a predefined step;
- finally, aforementioned main advantages of the proposed contact node allow a substantial reduce of the assembling and equipment cost while increasing the equipment quality and reliability.

The invention claimed is:

1. A contact node comprising:
    at least two metallized contacts coupled with first and second conductive paths arranged on surfaces of under-lying and upper-lying connection layers, respectively, made on the base of a dielectric material and mutually aligned and interconnected electrically and mechanically by conductive binding material, wherein it is made in the form of joint between a contact made in the form of metallized contact pad coupled with the second conductive path on the surface of the under-lying connection layer, and a respective contact jointed with said contact pad via conductive binding material and made in the form of a metallized hole through the upper-lying connection layer, the metallized hole having an inner surface thereof connected to the first conductive path, the lower edge of the metallized hole being faced to the metallized contact pad on the surface of the underlying connection layer, wherein a contact made in the form of a rod fixed in the under-lying connection layer orthogonally to its surface is inserted into the metallized hole.

2. The contact node according to claim 1, wherein the rod has the form of cylinder.

3. The contact node according to claim 1, wherein the rod has the form of polygon.

4. The contact node according to claim 1, wherein grooves are made along the generatrix of the rod.

5. The contact node according to claim 4, wherein the grooves are made interrupted.

6. The contact node according to claim 1, wherein the rod is made from a conductive material.

7. The contact node according to claim 1, wherein the rod is made from an electrical insulating material with a conductive coating.

8. The contact node according to claim 1, wherein the metallized hole is made in the form of a truncated cone, the lesser base of the truncated cones being faced to the contact pad on the surface of the under-lying connection layer, and the greater base of the truncated cones being coupled with the first conductive path on the upper surface of the upper-lying connection layer, wherein the upper edge of the metallized hole coupled with the first conductive path on the surface of the upper-lying connection layer is made with a metallized rim along the periphery of the edge, and wherein the diameter D of the greater base of the truncated cone, the width h of the metallized rim, the diameter d of the lesser base of the truncated cone, the thickness t of the dielectric material of the connection layer and the minimal width L of the respective metallized contact pad on the underlying connection layer are coupled with the following relationship:

$$L \geq D+2h=d+2t+2h.$$

9. The contact node according to claim 1, wherein the upper edge of the metallized hole coupled with the first conductive path and a lower edge of the metallized hole are made with metallized rims on the surfaces of the under-lying connection layer along the periphery of the edges.

* * * * *

UNITED STATES PATENT AND TRADEMARK OFFICE
CERTIFICATE OF CORRECTION

PATENT NO. : 7,371,973 B1
APPLICATION NO. : 09/830635
DATED : May 13, 2008
INVENTOR(S) : Alexander Ivanovich Taran It is certified that error appears in the above-identified patent and that said Letters Patent is hereby corrected as shown below:

At Title page, column 1 (Inventor), line 2, delete "Alexandr" and insert -- Alexander --, therefor.

At column 8, line 21, in Claim 2, after "form of" insert -- a --.

At column 8, line 23, in Claim 3, after "form of" insert -- a --.

At column 8, line 24 - 25 (Approx.), in Claim 4, delete "grooves are made along the generatrix of the rod." and insert -- the rod has grooves made along the generatrix thereof. --, therefor.

At column 8, delete 28, in Claim 5, after "are" delete "made".

Signed and Sealed this

Sixth Day of January, 2009

JON W. DUDAS
*Director of the United States Patent and Trademark Office*